United States Patent
Sharma et al.

(10) Patent No.: US 9,148,159 B1
(45) Date of Patent: Sep. 29, 2015

(54) DUAL COMPARATOR-BASED ERROR CORRECTION SCHEME FOR ANALOG-TO-DIGITAL CONVERTERS

(71) Applicant: Texas Instruments Incorporated, Dallas, TX (US)

(72) Inventors: Ajit Sharma, Dallas, TX (US); Seung Bae Lee, Atlanta, GA (US); Srinath M. Ramaswamy, Murphy, TX (US); Sriram Narayanan, Richardson, TX (US); Arup Polley, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 23 days.

(21) Appl. No.: 14/209,813

(22) Filed: Mar. 13, 2014

(51) Int. Cl.
*H03M 1/06* (2006.01)
*H03M 1/12* (2006.01)
*H03M 1/36* (2006.01)
*H03M 1/44* (2006.01)
*H03M 1/00* (2006.01)

(52) U.S. Cl.
CPC .......... *H03M 1/0675* (2013.01); *H03M 1/1245* (2013.01); *H03M 1/36* (2013.01); *H03M 1/44* (2013.01); *H03M 1/00* (2013.01); *H03M 1/12* (2013.01)

(58) Field of Classification Search
CPC .................................. H03M 1/00; H03M 1/12
USPC .......................... 341/118, 120, 122, 110, 155
See application file for complete search history.

(56) References Cited

U.S. PATENT DOCUMENTS 6,486,806 B1 * 11/2002 Munoz et al. ................. 341/120

* cited by examiner

*Primary Examiner* — Joseph Lauture
(74) *Attorney, Agent, or Firm* — John R. Pessetto; Charles A. Brill; Frank D. Cimino

(57) ABSTRACT

An analog-to-digital converter (ADC) includes a first comparator, a second comparator, and a decision timing comparison logic unit. The first comparator is configured to output a first output voltage and the second comparator is configured to output a second output voltage during a same binary algorithmic iteration of the ADC. The decision timing comparison logic unit is configured to identify a first polarity of the first output voltage and a second polarity of the second output voltage and, if the first polarity is equivalent to a second polarity, to insert at least one redundant capacitor for a next binary algorithmic iteration of the ADC.

20 Claims, 5 Drawing Sheets

| CONDITION | | COMP OUTPUT | DECISION TIME |
|---|---|---|---|
| $V_{i+} \gg V_{i-}$ 25 | COMP1 | + | FAST |
| | COMP2 | − | SLOW |
| $V_{i+} \ll V_{i-}$ 26 | COMP1 | − | SLOW |
| | COMP2 | + | FAST |
| $V_{i+} > V_{i-}$ 27 | COMP1 | + | FAST |
| | COMP2 | + | SLOW |
| $V_{i+} < V_{i-}$ 28 | COMP1 | + | SLOW |
| | COMP2 | + | FAST |

DUAL COMPARATOR-BASED ERROR CORRECTION SCHEME FOR ANALOG-TO-DIGITAL CONVERTERS

TECHNICAL FIELD

This application relates generally to analog-to-digital converters. More specifically, this disclosure relates to a dual comparator-based error correction scheme for analog-to-digital converters.

BACKGROUND

Analog-to-digital converters (ADCs) convert analog input signals into digital representations. Many ADCs operate using a successive approximation register (SAR) technique. A SAR ADC sequentially compares an analog input voltage to various reference voltage levels generated by a digital-to-analog converter (DAC). For example, during a first clock cycle, a first bit decision relating to the most significant bit (MSB) is made based on whether the analog input voltage is greater than half the reference voltage. During the next clock cycle, another bit decision relating to the second most significant bit (MSB-1) is made based on whether the analog input voltage is greater than one quarter or three quarters of the reference voltage. The conversion procedure continues accordingly, and the DAC's output converges successively to the analog input voltage while evaluating one bit during each clock cycle.

Some SAR ADCs use a charge redistribution technique with an array of capacitors. A charge stored on the capacitors is manipulated to perform the conversion from the analog domain to the digital domain. Some SAR ADCs also include a least significant bit (LSB) capacitor that is connected to a resistor network. Various tap points along the resistor network are coupled to the LSB capacitor to generate additional bit decisions.

Because SAR ADCs typically include capacitors and resistors, voltages generated based on a reference voltage take some amount of time to settle before bit decisions can be made. The settling time of an ADC can therefore detrimentally affect its performance. Also, SAR ADCs often fix the input voltage and sequentially vary the reference voltage, which can lead to errors. Many SAR ADCs use a redundant capacitor approach for error correction, but there is no way of knowing the point where a comparator has to make a critical decision for a given input (and thus no way of knowing for the given input where to apply a redundant capacitor).

SUMMARY

This disclosure provides a dual comparator-based error correction scheme for analog-to-digital converters.

In a first example, a method includes sampling a first output voltage of a first comparator and a second output voltage of a second comparator during a same binary algorithmic iteration of an analog-to-digital converter (ADC). The method also includes identifying a first polarity of the first output voltage and a second polarity of the second output voltage. The method further includes, if the first polarity is equivalent to the second polarity, inserting at least one redundant capacitor for a next binary algorithmic iteration of the ADC.

In a second example, an ADC includes a first comparator, a second comparator, and a decision timing comparison logic unit. The first comparator is configured to output a first output voltage and the second comparator is configured to output a second output voltage during a same binary algorithmic iteration of the ADC. The decision timing comparison logic unit is configured to identify a first polarity of the first output voltage and a second polarity of the second output voltage and, if the first polarity is equivalent to a second polarity, to insert at least one redundant capacitor for a next binary algorithmic iteration of the ADC.

In a third example, a non-transitory computer readable medium embodies a computer program. The computer program includes computer readable program code for sampling a first output voltage of a first comparator and a second output voltage of a second comparator during a same binary algorithmic iteration of an ADC. The computer program also includes computer readable program code for identifying a first polarity of the first output voltage and a second polarity of the second output voltage. The computer program further includes computer readable program code for inserting at least one redundant capacitor for a next binary algorithmic iteration of the ADC if the first polarity is equivalent to the second polarity.

Other technical features may be readily apparent to one skilled in the art from the following figures, descriptions, and claims.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION

FIGS. 1 through 7, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1:
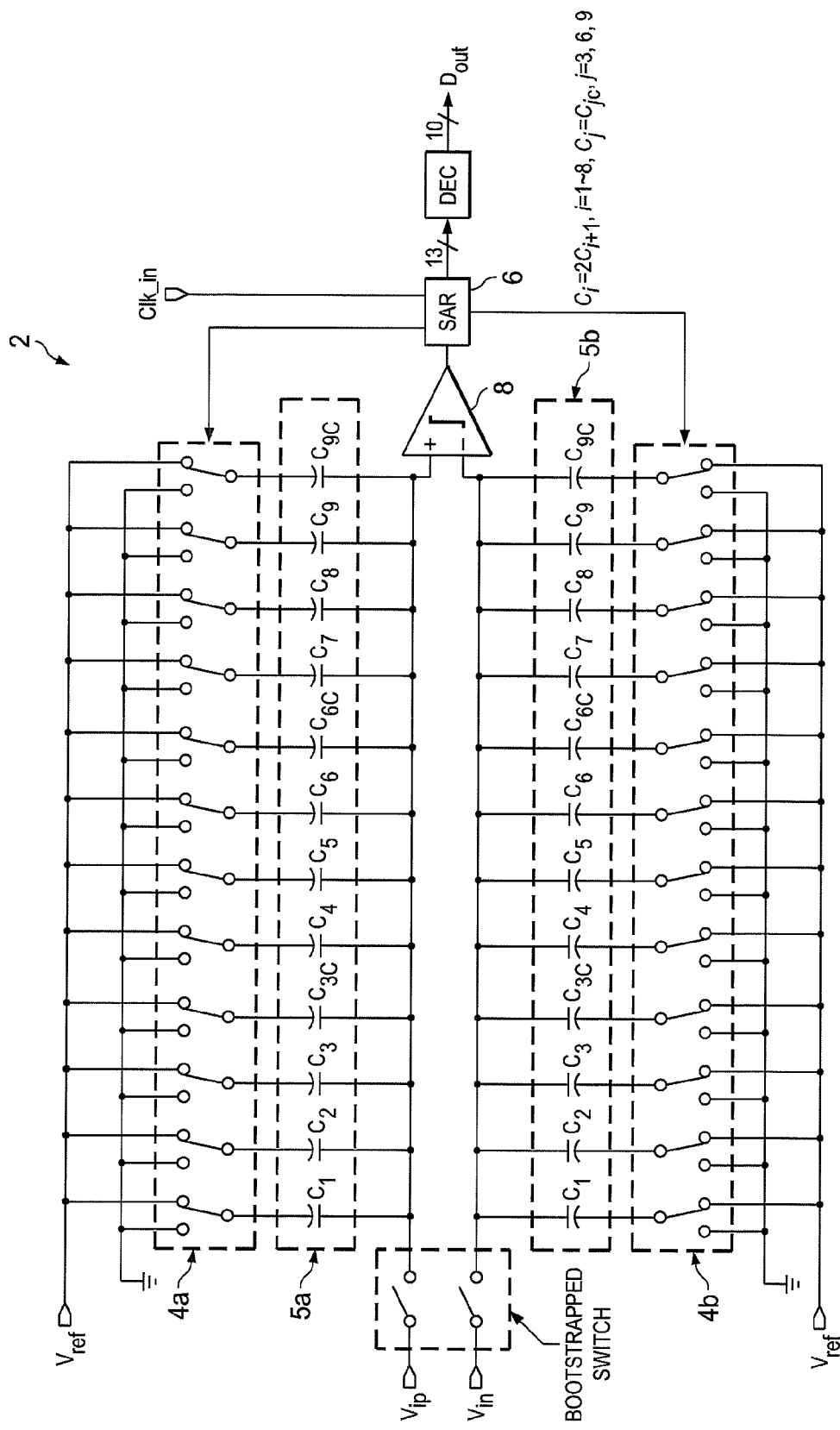
FIG. 1 illustrates an example analog-to-digital converter (ADC)

FIG. 1 illustrates an example analog-to-digital converter (ADC) 2. As shown in FIG. 1, the ADC 2 includes various switches 4a-4b and capacitors 5a-5b. The number of capacitors and switches can be varied to achieve whatever level of digital conversion resolution is desired for a given application. In operation, switches 4a-4b are closed and opened to $V_{in}$ and $V_{ip}$. The switches 4a-4b are also connected to a reference voltage $V_{ref}$.

The analog-to-digital conversion process here is a multi-step process. Upper-order bits are determined using the switches 4a-4b and successive approximation register (SAR) logic 6. During the first conversion step, the largest capacitor is connected via its corresponding switch to the reference voltage $V_{ref}$, which corresponds to the full-scale range of the ADC 2. The largest capacitor forms a capacitor divider with the remaining capacitors, which are connected to ground and which cumulatively have an equivalent capacitance to the largest capacitor. As such, one half of $V_{ref}$ is superimposed on the inverting input of a comparator 8, which already has a voltage of $-V_{in}$. Thus, the voltage on the inverting terminal of the comparator 8 is $-V_{in}+V_{ref}/2$.

The midpoint of the full $V_{ref}$ voltage range ($V_{ref}/2$) (also referred to as the "most significant bit voltage") is the voltage at which the most significant bit changes between a "0" and a "1." That is, if $V_{in}$ is less than $V_{ref}/2$, the most significant bit is a "0." If $V_{in}$ is greater than $V_{ref}/2$, the most significant bit is a "1." The inverting input to the comparator 8 has the voltage $-V_{in}+V_{ref}/2$, and the non-inverting input of the comparator 8 has a voltage equal to ground. Thus, the output of the comparator 8 is a "1" if $V_{in}$ is greater than $V_{ref}/2$ and a "0" if $V_{in}$ is less than $V_{ref}/2$. The output state of the comparator 8 is captured and stored by the SAR logic 6 as the most significant bit. At this point, it is known whether the input voltage $V_{in}$ is in the lower half of the full $V_{ref}$ voltage range or in the upper half of the full $V_{ref}$ voltage range.

To determine the next most significant bit, the next switch is controlled by the SAR logic 6 to connect $V_{ref}$ to the next capacitor. If the first conversion step for the most significant bit determined that the most significant bit is a "0," the next switch is flipped to ground. Otherwise, the next switch is connected to $V_{ref}$. The inverting input to the comparator 8 is equal to $-V_{in}+\frac{3}{4}(V_{ref})$ if the most significant bit from the first step was a "1." The inverting input to the comparator 8 is equal to $-V_{in}+\frac{1}{4}(V_{ref})$ if the most significant bit from the first step was a "0."

Stated another way, the node voltage on the inverting input to the comparator 8 is forced to the midpoint voltage of whichever voltage range (upper half or lower half) was determined to contain $V_{in}$. The output of the comparator 8 indicates in which half of the upper/bottom half (which quartile) $V_{in}$ lies. For example, if the first step resulted in a most significant bit of "0," it is known that $V_{in}$ is between ground and $V_{ref}/2$. In the second cycle, the range between ground and $V_{ref}/2$ (in which $V_{in}$ is known to reside) is itself divided in two equal portions by a midpoint voltage ($V_{ref}/4$), and $V_{in}$ is again compared to the new midpoint voltage. If $V_{in}$ is below the new midpoint voltage, the next most significant bit is a "0"; otherwise the next most significant bit is a "1." This process continues for each succeeding capacitor until all of the bits are determined.

Note that the above operations have been described for cases where the input signal is sampled on the top plates of the capacitors (as shown in FIG. 1). However, those skilled in the art will recognize that a similar methodology for determining bits can be used when the input signal to be converted is sampled at the bottom plates of the capacitors (also known as bottom-plate sampling).

Figures 2, 3:
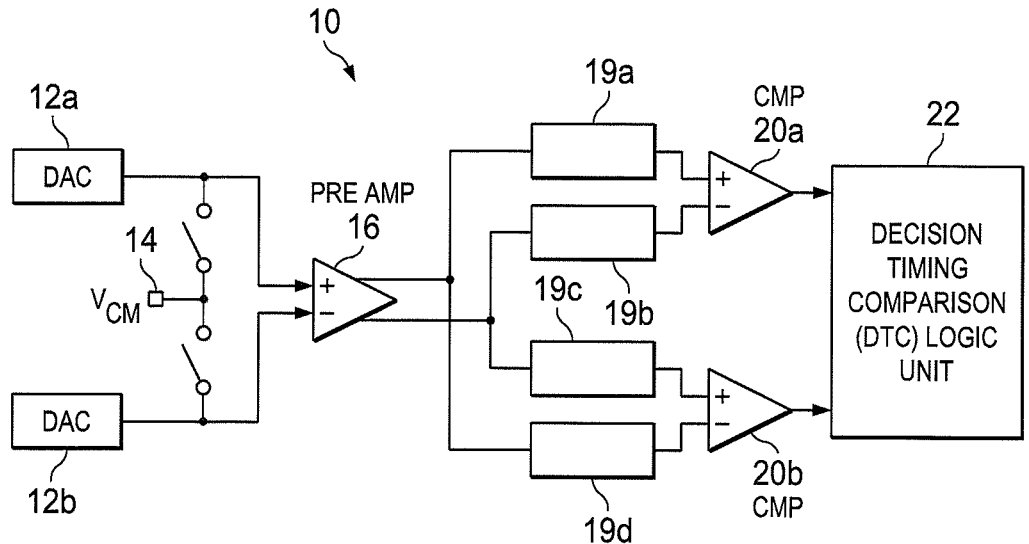
FIG. 2 illustrates an example ADC that could implement either bottom-plate sampling or top-plate sampling in accordance with an embodiment of this disclosure.
FIG. 3 illustrates an example voltage polarity output table in accordance with an embodiment of this disclosure.

FIG. 2 illustrates an example ADC 10 that could implement either bottom-plate sampling or top-plate sampling in accordance with an embodiment of this disclosure. The ADC 10 can have any desired number of bits. For example, the ADC 10 may be a 12-bit converter, meaning that an analog input voltage is converted into a 12-bit output digital representation. Digital representations other than 12 bits are also possible.

The ADC 10 is a SAR-class ADC and includes two digital-to-analog converters (DACs) 12a-12b, a common mode (CM) voltage 14, a preamplifier (preamp) 16, programmable control modules 19a-19d, two comparators 20a-20b, and a decision timing comparison (DTC) logic unit 22. The DACs 12a-12b may incorporate the sampling function either on the top-plate or on the bottom-plate of a capacitor.

The comparators 20a-20b are configured to compare the voltage generated by the DAC 12a to the voltage generated by the DAC 12b. Each of the comparators 20a-20b sequentially generates one output bit at a time during the conversion process. Each comparator 20a-20b is further configured to output a voltage, where the output voltage includes a polarity.

Various embodiments of this disclosure recognize and take into account that comparator decision errors appear in SAR ADCs. For example, these errors can occur when the inputs to the comparator 8 are very close to one another and the comparator 8 is unable to resolve the voltage difference. These errors can also occur due to the incomplete settling of the comparator 8 due to speed constraints set by a clock. Once a wrong decision error has been made, the SAR algorithm cannot recover, and subsequent ADC conversions will be incorrect.

To overcome these types of problems, the ADC 10 shown in FIG. 2 uses multiple comparators 20a-20b. While two comparators 20a-20b are shown in FIG. 2, other embodiments may use a different number of comparators. Using multiple comparators 20a-20b helps to give the ADC 10 some knowledge about which decision in the successive approximation sequence is the critical decision. In some embodiments, the comparators 20a-20b can have slightly different and pre-set DC offsets. In other embodiments, the comparators 20a-20b can include slightly differently programmed offsets to determine whether a decision is a critical decision by relying on each comparator's inherent meta-stability. The critical decision is one where electrical noise or the like in the DACs 12a-12b and the comparators 20a-20b or an insufficient settling time of the DACs 12a-12b may cause a voltage reading to deviate. If this occurs, the outputs of the comparators 20a-20b would have the same polarity, which can be indicative that the current decision is the critical decision.

To set the comparators' offsets accurately, floating gate transistors can be used for the comparators' design. In some embodiments, floating gate transistors can be used to set a known offset. In other embodiments, the DACs 12a-12b can be used for automatic setting of the offset. In yet other embodiments, transistors can be sized separately and/or biased differently to generate a fixed controllable offset.

In an embodiment, ADC 10 may include programmable control modules 19a-19d. Programmable control modules 19 may be configured to introduce a variable offset voltage, variable current, or variable charge, based on comparator and DAC topology at any of the outputs of pre-amp 16 before they are input into comparators 20. In one or more embodiments, control modules 19 may each, or individually, be programmed by a programmable analog or digital control.

This disclosure also recognizes and takes into account that the error tolerance of redundant capacitors depends on the error-occurring location across the DACs 12a-12b. Existing techniques that use redundant capacitors to address comparator decision errors often place sets of redundant capacitors at regular intervals across the DACs. However, each addition of a redundant capacitor step increments the number of SAR conversion cycles by one, increasing the overall conversion time. Various embodiments described here may only insert a redundant capacitor at the error-occurring region. This approach can increase the efficiency of the binary search algorithm and the conversion speed of the ADC 10 while reducing the size of the ADC 10.

In some embodiments, the offset, bias, or other parameters in the ADC 10 may be set to overcome a specific amount of electrical noise, error, or the like of the DACs 12a-12b and/or the comparators 20a-20b. In particular embodiments, the offset or the like may be set to overcome most errors. In other particular embodiments, the offset or the like may be set low enough to overcome a constant static error, which represents an error common in every iteration.

Various embodiments also recognize and take into account that prior techniques use a redundant capacitor approach, but it may not be known at which point in the binary search the comparator has to make a critical decision for a given input sample. Therefore, it is unknown, for a given signal, where to apply the redundant capacitor. In some existing solutions, an extra redundant capacitor is placed after every four decisions, but this limits the speed and increases the size of the ADC, thereby making the ADC unsuitable for high-speed applications.

To overcome this type of problem, the DTC logic unit 22 is configured to identify whether the polarities of the outputs of the comparators 20a-20b are the same. If the comparators' inputs are not very close (meaning the current decision is not a critical decision), the comparators' outputs are of opposite polarity. However, if the comparators' inputs are close (meaning the current decision is a critical decision), the comparators' outputs are of the same polarity. When a particular decision is identified as being a critical decision, a SAR logic unit can switch in one or more redundant capacitors during the next iteration.

In some embodiments, the DTC logic unit 22 may be part of a SAR logic unit or a separate module. In particular embodiments, the DTC logic unit 22 may be implemented using hardware or using a combination of hardware and software/firmware instructions.

FIG. 3 illustrates an example voltage polarity output table 24 in accordance with an embodiment of this disclosure. The table 24 here is representative of a table of voltage outputs from the comparators 20a-20b. In this example, the table 24 includes four conditions on the output voltage of the comparator 20a compared to the output voltage of the comparator 20b. In some embodiments, using the table 24 and both comparators' outputs, a SAR logic unit can switch in a redundant capacitor at the next iteration when a particular decision is identified as being a critical decision. In particular embodiments, the table 24 may be computed by the DTC logic unit 22 as shown in FIG. 2.

In row 25 of the table 24, the input of the positive terminal of the comparator 20a is much greater than the input of the negative terminal of the comparator 20a. The output voltage of the comparator 20a has a positive polarity, and the output voltage of the comparator 20b has a negative polarity. The difference between the positive terminal of the comparator 20a and the negative terminal of the comparator 20a is greater than the preset offset.

In row 26 of the table 24, the input of the negative terminal of the comparator 20a is much greater than the input of the positive terminal of the comparator 20a. The output voltage of the comparator 20a has a negative polarity, and the output voltage of the comparator 20b has a positive polarity.

In row 27 of the table 24, the input of the positive terminal of the comparator 20a is slightly greater than the input of the negative terminal of the comparator 20a (but less than the positive preset offset voltage). The output voltage of the comparator 20a may have a positive polarity, and the output voltage of the comparator 20b also has a positive polarity. In this case, if the polarity of both output voltages is the same, the current iteration of the ADC process identifies the current bit as being a critical decision.

In row 28 of the table 24, the input of the negative terminal of the comparator 20a is slightly greater than the input of the positive terminal of the comparator 20a (but less than the positive preset offset voltage). The output voltage of the comparator 20a has a positive polarity, and the output voltage of the comparator 20b has a positive polarity. In that case, if the polarity of both output voltages is the same, the current iteration of the ADC process again identifies the current bit as being a critical decision.

In some embodiments, the table 24 also shows the decision time for each DAC. The DTC logic unit 22 can monitor the decision time of each DAC to identify the settling time of the ADC 10.

Also, in some embodiments, the outputs of the comparators 20a-20b can be used in conjunction with the DTC logic unit 22 as an additional failsafe layer in rows 27 and 28. This may be useful with high-speed ADCs where it might be possible to resolve timing delays more accurately than minute voltage differences. An example of this is a final LSB decision, where redundant capacitors cannot be used. In such embodiments, the time comparison result can be used to determine the comparator polarity.

Figure 4:
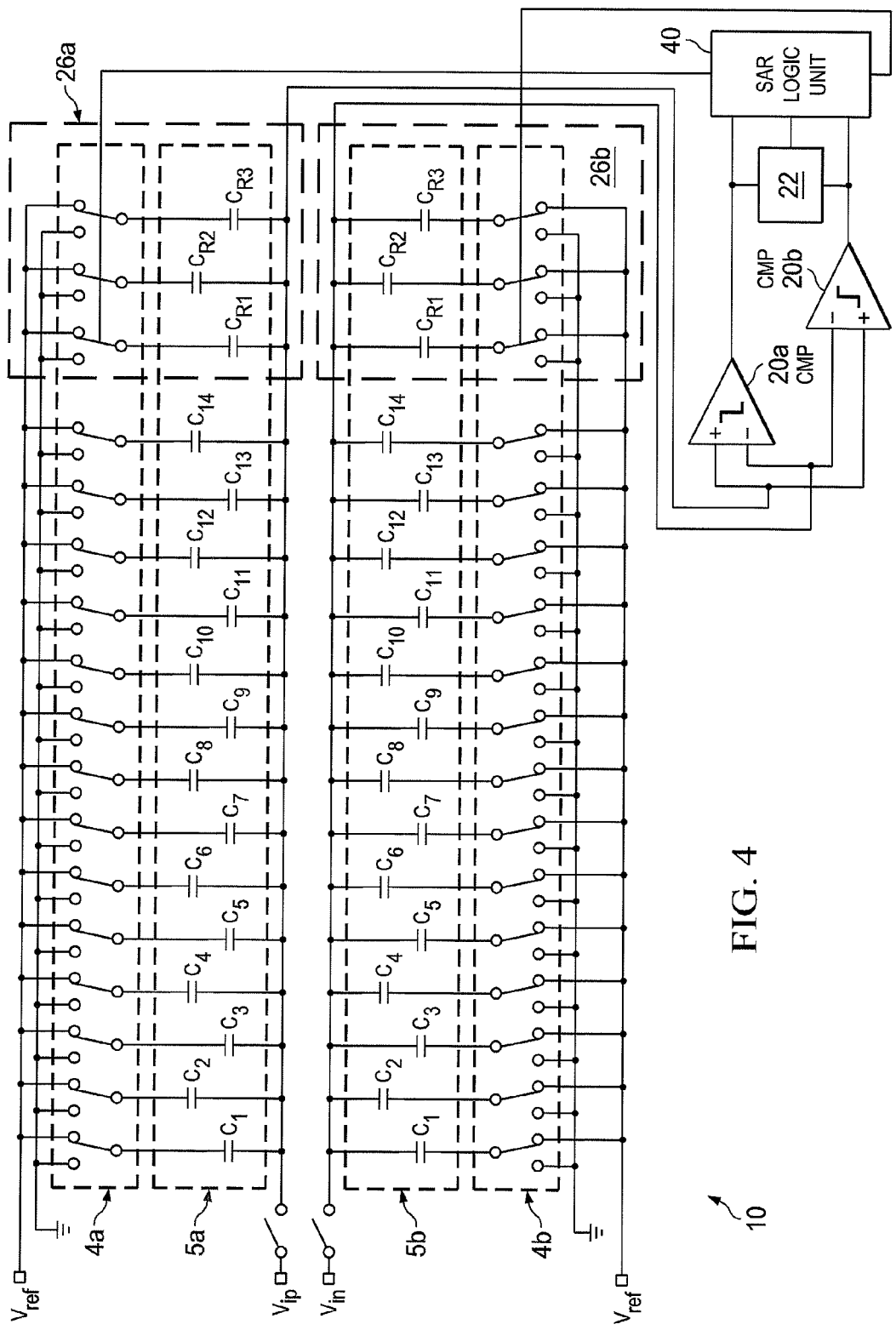
FIG. 4 illustrates a particular implementation of the ADC of FIG. 2 in accordance with an embodiment of this disclosure.

FIG. 4 illustrates a particular implementation of the ADC 10 of FIG. 2 in accordance with an embodiment of this disclosure. More specifically, the ADC 10 includes the switches 4a-4b and capacitors 5a-5b from FIG. 1, along with the comparators 20a-20b and DTC logic unit 22 of FIG. 2. In the ADC 10, the number of capacitors and switches can be varied to achieve whatever level of digital conversion resolution is desired for a given application. Also note that while FIG. 4 shows a top-plate sampling approach, a bottom-plate sampling scheme could also be used.

In operation, the switches 4a-4b are closed and opened to $V_{in}$ and $V_{ip}$, and the switches 4a-4b are also connected to a reference voltage $V_{ref}$. The analog-to-digital conversion process again is a multi-step process. The upper-order bits are determined by a SAR logic unit 40 and the switches 4a-4b. The ADC 10 differs from the ADC 2 in that the ADC 10 includes redundant capacitors 26a-26b, the dual comparators 20a-20b, and the DTC logic unit 22.

In some embodiments, the meta-stability result (seeing if the comparators' outputs are the same or different) can be combined with the use of redundant capacitors by moving the same set of capacitors across the capacitor array for use as redundant capacitors with comparator error correction. This structure precludes the need to add one or more banks of redundant capacitors for comparator error correction.

Figure 5:
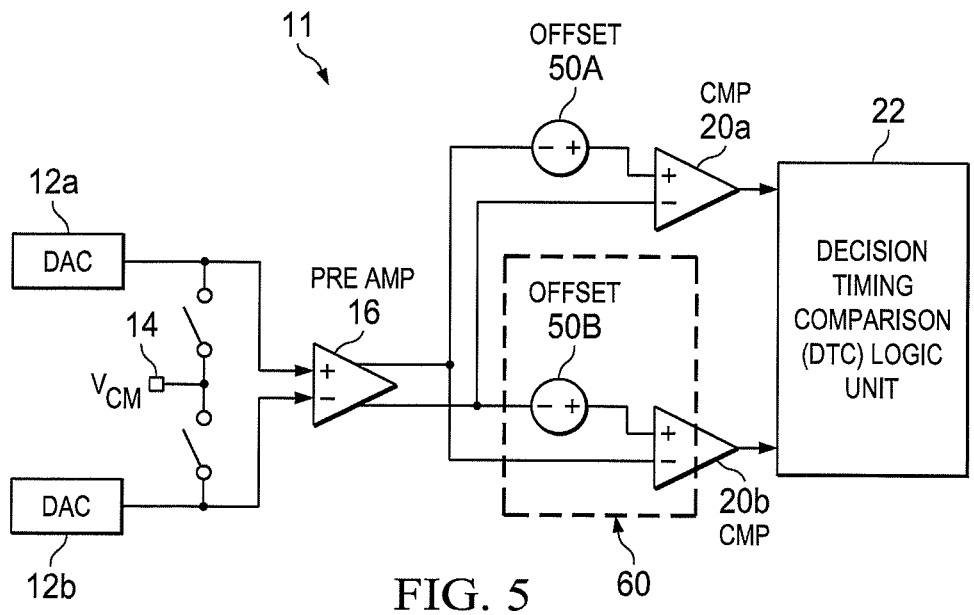
FIG. 5 illustrates an example ADC with offsets that could implement either bottom-plate sampling or top-plate sampling in accordance with an embodiment of this disclosure

FIG. 5 illustrates an example ADC 11 with offsets 50a-50b that could implement either bottom-plate sampling or top-plate sampling in accordance with an embodiment of this disclosure. The ADC 11 is similar to the ADC 10, except the ADC 11 further includes the offsets 50a-50b (which in this example are implemented as voltage sources).

Note that while the offsets 50a-50b are shown as being separate from the comparators 20a-20b, the offsets 50a-50b could also form part of the comparators 20a-20b. For example, a circuit 60 can be used to implement both an offset 50a-50b and at least a portion of a comparator 20a-20b. In some embodiments, floating gate transistors can be used in the circuit 60 to set a known offset value.

Figure 6:
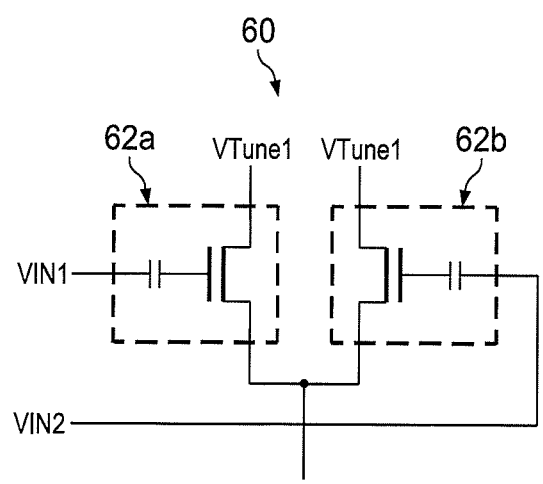
FIG. 6 illustrates an example circuit of analog floating gate transistors in accordance with an embodiment of this disclosure.

FIG. 6 illustrates an example circuit 60 of analog floating gate transistors 62a-62b in accordance with an embodiment of this disclosure. The analog floating gate transistors 62a-

62b may be used to store programmable analog offsets in the form of charges at the gates of a comparator 20a-20b.

Figure 7:
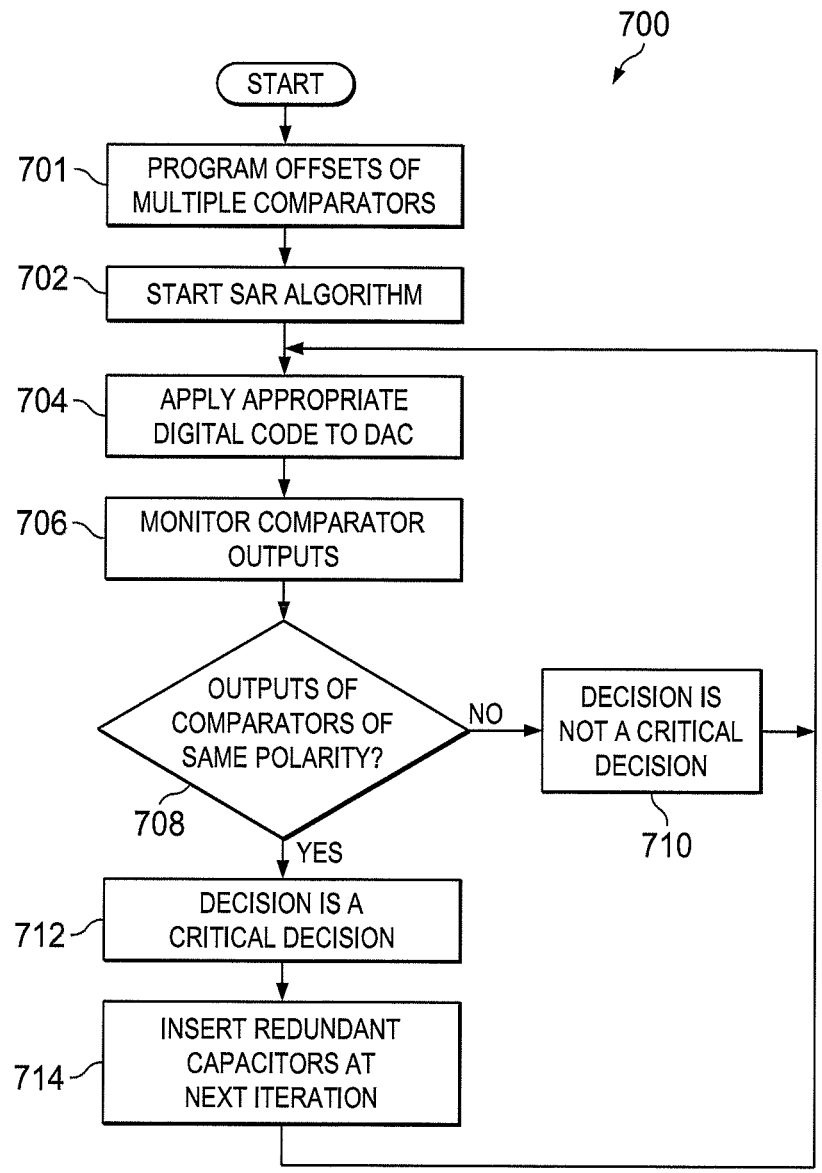
FIG. 7 illustrates an example process for driving an ADC in accordance with an embodiment of this disclosure.

FIG. 7 illustrates an example process 700 for driving an ADC in accordance with an embodiment of this disclosure. For ease of explanation, the method 700 is described with respect to the ADC 10 as shown in FIG. 2 and FIG. 4. The method 700 could be used with any other suitable ADC.

As shown in FIG. 7, at operation 701, offsets of multiple comparators are programmed. The offsets may be set dynamically, manually by a user, or the like. The offsets may also be set as part of a factory calibration, in the field, or at any other suitable time(s). The offsets may be set before and/or during a SAR binary search process. In addition, the offsets can be programmed by any suitable component of the ADC 10, such as the SAR logic unit 40, the DTC logic unit 22, the comparators 20a-20b, some other type of logic unit, and/or a combination thereof.

At operation 702, an SAR algorithm begins execution. As described above, the SAR algorithm can involve multiple iterations, where each bit of the digital output of the ADC 10 is set during one of the iterations. As part of each iteration, at operation 704, an appropriate digital code is applied to at least one DAC capacitor array. This could include, for example, the SAR logic unit 40 opening and closing the appropriate switches 4a-4b to couple the appropriate capacitors 5a-5b to the comparators 20a-20b.

At operation 706, outputs of the multiple comparators are monitored. This could include, for example, the DTC logic unit 22 receiving the outputs of the comparators 20a-20b, where the outputs of the comparators 20a-20b represent voltages with one or more polarities. In some embodiments, the DTC logic unit 22 may monitor only the polarities of the comparators' outputs.

At operation 708, a determination is made whether the outputs of multiple comparators are of the same polarity. This could be performed at the DTC logic unit 22. If not, a determination is made at operation 710 that the current iteration of the SAR algorithm does not involve a critical decision. The process 700 then returns to step 704 for the next iteration of the SAR algorithm.

If the outputs of multiple comparators are of the same polarity, a determination is made at operation 712 that the current iteration of the SAR algorithm does involve a critical decision. In response, one or more redundant capacitors are inserted into the ADC during the next iteration of the SAR algorithm. In some embodiments, the one or more redundant capacitors 26a-26b may be inserted by controlling the switches 4a-4b coupling the capacitors 26a-26b to the reference voltage $V_{ref}$. The process 700 then returns to step 704 for the next iteration of the SAR algorithm. The iterations can continue until all bits of the digital output have been completed.

Although the figures above have shown various systems, devices, and methods for designing and operating ADCs, various changes can be made to these figures without departing from the scope of this disclosure. For example, the functional divisions shown in each ADC are for illustration only. Various components in each ADC could be combined, further subdivided, or omitted and additional components could be added according to particular needs. Also, while the steps in FIG. 7 are shown as being performed serially, various steps in each figure could overlap, occur in parallel, occur in a different order, or occur any number of times.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
sampling a first output voltage of a first comparator and a second output voltage of a second comparator during a same binary algorithmic iteration of an analog-to-digital converter (ADC);
identifying a first polarity of the first output voltage and a second polarity of the second output voltage; and
if the first polarity is equal to the second polarity, inserting at least one redundant capacitor for a next binary algorithmic iteration of the ADC.

2. The method of claim 1, further comprising:
if the first polarity is not equal to the second polarity, performing the next binary algorithmic iteration of the ADC without the at least one redundant capacitor.

3. The method of claim 1, wherein the ADC comprises a successive approximation register (SAR) ADC.

4. The method of claim 1, wherein at least one of the first and second comparators includes an offset.

5. The method of claim 1, wherein at least one of the first and second comparators is biased.

6. The method of claim 1, wherein:
   each binary algorithmic iteration of the ADC comprises generating first and second voltages;
   the first voltage is coupled to a positive terminal of the first comparator and a negative terminal of the second comparator; and
   the second input voltage is coupled to a negative terminal of the first comparator and a positive terminal of the second comparator.

7. The method of claim 6, wherein at least one of the first and second voltages is offset.

8. The method of claim 1, wherein at least one of the first and second comparators includes one or more floating gate transistors.

9. An analog-to-digital converter (ADC) comprising:
   a first comparator configured to output a first output voltage and a second comparator configured to output a second output voltage during a same binary algorithmic iteration of the ADC; and
   a decision timing comparison logic unit configured to identify a first polarity of the first output voltage and a second polarity of the second output voltage and, if the first polarity is equal to the second polarity, to insert at least one redundant capacitor for a next binary algorithmic iteration of the ADC.

10. The ADC of claim 9, wherein the ADC is configured to sample the next binary algorithmic iteration of the ADC if the first polarity is not equal to the second polarity.

11. The ADC of claim 9, wherein the ADC comprises a successive approximation register (SAR) ADC.

12. The ADC of claim 9, wherein at least one of the first and second comparators includes an offset.

13. The ADC of claim 9, wherein at least one of the first and second comparators is biased.

14. The ADC of claim 9, wherein the ADC is configured, during each binary algorithmic iteration, to:
   generate first and second voltages;
   provide the first voltage to a positive terminal of the first comparator and a negative terminal of the second comparator; and
   provide the second input voltage to a negative terminal of the first comparator and a positive terminal of the second comparator.

15. The ADC of claim 14, wherein at least one of the first and second voltages is offset.

16. The ADC of claim 9, wherein at least one of the first and second comparators includes one or more floating gate transistors.

17. A non-transitory computer readable medium embodying a computer program, the computer program comprising computer readable program code for:
   sampling a first output voltage of a first comparator and a second output voltage of a second comparator during a same binary algorithmic iteration of an ADC;
   identifying a first polarity of the first output voltage and a second polarity of the second output voltage; and
   inserting at least one redundant capacitor for a next binary algorithmic iteration of the ADC if the first polarity is equal to the second polarity.

18. The non-transitory computer readable medium of claim 17, wherein the computer program further comprises computer readable program code for:
   sampling the next binary algorithmic iteration of the ADC if the first polarity is not equal to the second polarity.

19. The non-transitory computer readable medium of claim 17, wherein the computer program further comprises computer readable program code for:
   controlling multiple switches during the binary algorithmic iterations of the ADC, the switches configured to control generation of first and second voltages during each binary algorithmic iteration.

20. The non-transitory computer readable medium of claim 17, wherein the computer program further comprises computer readable program code for:
   controlling multiple switches to insert the at least one redundant capacitor for the next binary algorithmic iteration of the ADC.

\* \* \* \* \*